(12) United States Patent  
Edwards et al.

(10) Patent No.: US 8,976,539 B2  
(45) Date of Patent: Mar. 10, 2015

(54) OPTICAL TRANSCEIVER HAVING CORRUGATED INNER SIDE SURFACES

(75) Inventors: Phillip J. Edwards, San Jose, CA (US); Jignesh H. Shah, San Jose, CA (US); Lance R. Thompson, San Jose, CA (US); Nhan Huynh, San Jose, CA (US)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 172 days.

(21) Appl. No.: 13/427,520

(22) Filed: Mar. 22, 2012

(65) Prior Publication Data

US 2012/0177379 A1 Jul. 12, 2012

Related U.S. Application Data

(63) Continuation of application No. 12/390,179, filed on Feb. 20, 2009, now Pat. No. 8,319,118.

(60) Provisional application No. 61/064,225, filed on Feb. 22, 2008.

(51) Int. Cl.
*H05K 9/00* (2006.01)
*H04B 10/02* (2006.01)
*G02B 6/42* (2006.01)

(52) U.S. Cl.
CPC ............ *H05K 9/0058* (2013.01); *G02B 6/4246* (2013.01); *G02B 6/4292* (2013.01)
USPC ........... 361/800; 174/350; 174/377; 174/384; 174/385; 361/816; 361/818

(58) Field of Classification Search
USPC ......... 361/800, 816, 818; 174/50.5, 350, 363, 174/366, 377, 382, 384, 385; 398/135; 277/920; 385/88, 92, 94
See application file for complete search history.

(56) References Cited

U.S. PATENT DOCUMENTS

| | | | |
|---|---|---|---|
| 2,778,868 A * | 1/1957 | Stinger | 174/373 |
| 4,763,225 A | 8/1988 | Frenkel et al. | |
| 5,260,513 A * | 11/1993 | Giles et al. | 174/390 |
| 6,121,545 A * | 9/2000 | Peng et al. | 174/377 |
| 6,206,582 B1 | 3/2001 | Gilliland | |
| 6,348,654 B1 * | 2/2002 | Zhang et al. | 174/362 |
| 6,608,251 B1 * | 8/2003 | Nurmi | 174/367 |
| 6,755,578 B1 * | 6/2004 | Mynatt et al. | 385/92 |
| 6,880,986 B2 | 4/2005 | Mynatt et al. | |
| 6,919,505 B2 * | 7/2005 | Cox | 174/382 |
| 7,195,403 B2 | 3/2007 | Oki et al. | |
| 7,286,372 B2 | 10/2007 | Aronson et al. | |
| 7,407,332 B2 | 8/2008 | Oki et al. | |
| 7,425,135 B2 | 9/2008 | Liu et al. | |

(Continued)

OTHER PUBLICATIONS

"Gigabit Small Form Factor Pluggable Module," XFP Promoters, Rev. 3.1, pp. 1-160, Apr. 2, 2003.

*Primary Examiner* — Angel R Estrada
*Assistant Examiner* — Dimary Lopez Cruz
(74) *Attorney, Agent, or Firm* — Venable LLP; Michael A. Sartori; Tamatane J. Aga

(57) ABSTRACT

An optical transceiver that reduces the EMI noise leaked therefrom is disclosed. The optical transceiver provides a metal housing, an optical subassembly, and an electronic circuit. The metal housing includes a first space to install the electronic circuit, and a second space to install the optical subassembly. At least the first space has inner surfaces having a corrugated shape to reduce the resonance of the electromagnetic waves.

4 Claims, 8 Drawing Sheets

(56) References Cited

U.S. PATENT DOCUMENTS

| | | |
|---|---|---|
| 7,603,019 B2 | 10/2009 | Hino et al. |
| 7,822,346 B2 | 10/2010 | Rosenberg |
| 7,995,355 B2 * | 8/2011 | Cochrane ................... 361/818 |
| 8,488,334 B2 * | 7/2013 | McColloch ................. 361/818 |
| 2008/0060842 A1 * | 3/2008 | Barringer et al. ........... 174/354 |
| 2008/0137320 A1 * | 6/2008 | Ball ............................ 361/818 |

* cited by examiner

OPTICAL TRANSCEIVER HAVING CORRUGATED INNER SIDE SURFACES

CROSS REFERENCE TO RELATED APPLICATIONS

The present application is a continuation of U.S. application Ser. No. 12/390,179 filed Feb. 20, 2008, which claims priority of U.S. Provisional Patent Application No. 61/064,225 filed on Feb. 22, 2008; the entire contents of all of which applications are incorporated herein by reference.

BACKGROUND OF THE INVENTION

1. Field of the Invention

The present invention relates to an optical transceiver, in particular, the invention relates to an EMI shielding structure of the optical transceiver.

2. Related Background Arts

The U.S. Pat. No. 7,195,403, has disclosed an arrangement of the interconnection from the connector plug exposed in the external of the optical transceiver to the electronic circuit set within the transceiver. In this arrangement, the interconnection is buried within the substrate, while the top and the back surfaces of the substrate provide the ground patterns each coming in contact with the shield gasket, which is made of electrically conductive elastic material, to shield the electronic circuit in the transceiver from the external.

Another U.S. Pat. No. 7,425,135, has disclosed a mechanism to fix the flexible printed circuit board with the substrate. The flexible printed circuit board electrically connects the optical sub-assembly, such as transmitter optical sub-assembly or receiver optical sub-assembly, with the electronic circuit prepared on the substrate. Further, the multi-source agreement, titled "10 Gigabit Small Form Factor Pluggable Module Rev. 3.1 (Apr. 2, 2003)" defines the specifications of one type of pluggable optical transceivers known as XFP transceiver.

As the transmission speed of the optical communication increases, some standard comes up to 10 Gbps and over 10 Gbps is practically designed, the electro-magnetic interference (EMI) noise leaked from the equipment becomes an important subject. As a characteristic wavelength becomes shorter, even a slight gap in the equipment, which conventionally causes no effect for the EMI leakage, results in a large EMI noise with high frequency components. The U.S. Pat. No. 7,195,403 above described has disclosed an effective mechanism to shield between the primary electronic unit within the optical transceiver and the connector plug exposed externally. However, it is inevitable for the optical transceiver to provide an optical path in a side where the optical connector is mated that opens the primary electronic unit to the outside. Thus, it is necessary for the optical transceiver capable of transmitting high-frequency signals to provide some shielding mechanism for the high frequency EMI noise in the side of the optical connector.

Moreover, in such equipment that processes the high frequency signals, a resonance frequency, which is roughly determined by the physical dimensions of the space where the electronic circuit is primarily installed therein, may partially overlap with the operational frequency of the optical transceiver. This overlapping of the resonance frequency with the operational frequency degrades the frequency characteristic of the transceiver. As the frequency spectrum of the resonance becomes sharp, the degradation in the frequency characteristic of the transceiver is apparent.

One type of the optical transceiver is used in the host system such that the transceiver is inserted into the cage prepared in the host system to mate the connector plug provided in the rear end of the transceiver with the connector installed in the deep end of the cage, which secures the communication between the transceiver and the host system. Such an optical transceiver is called as the pluggable transceiver. Because the transceiver is inserted into the cage, the outer dimensions thereof are regulated in a type of a multi-source agreement (MSA). Therefore, it is practically impossible to adjust the dimensions of the transceiver to escape from the overlapping of the resonance frequency with the operating frequency. It is necessary to shift the resonance frequency from the operating frequency, or to moderate the frequency spectrum of the resonance in the optical transceiver whose dimensions are independently determined.

SUMMARY OF THE INVENTION

The present invention, which is to provide a solution for subjects described above, has a feature to reduce the electromagnetic resonance within the metal housing. The optical transceiver according to the present invention has a function for the host system, where the optical transceiver is to be installed therein, to convert an optical signal to an electrical signal mutually. The transceiver comprises an electrically conductive upper housing, an electrically conductive lower housing, an electronic circuit and an optical subassembly. The upper and lower housings form, by assembling with respect each other, a first space and a second space. The first space installs the electronic circuit therein, while, the second space installs the optical subassembly therein. In the present invention, the first space and the second space are electrically shielded each other in addition that both spaces are shielded from an external.

The optical transceiver of the invention may further include a circuit substrate to install the electronic circuit thereon. The circuit substrate extends from the second space in an end thereof to be connected with the optical subassembly to the external in another end thereof to be mated with the host system through the first space. The circuit substrate may provide a ground pattern at a boundary around the first space.

In the optical transceiver according to an embodiment thereof, at least the first space has inner surfaces with a corrugated shape to reduce the resonance of the electromagnetic wave. The corrugated shapes has various pitches to reduce the resonance further.

The present invention is better understood upon consideration of the detailed description below and the accompanying drawings.

DETAILED DESCRIPTION OF PREFERRED EMBODIMENTS

Figure 1:
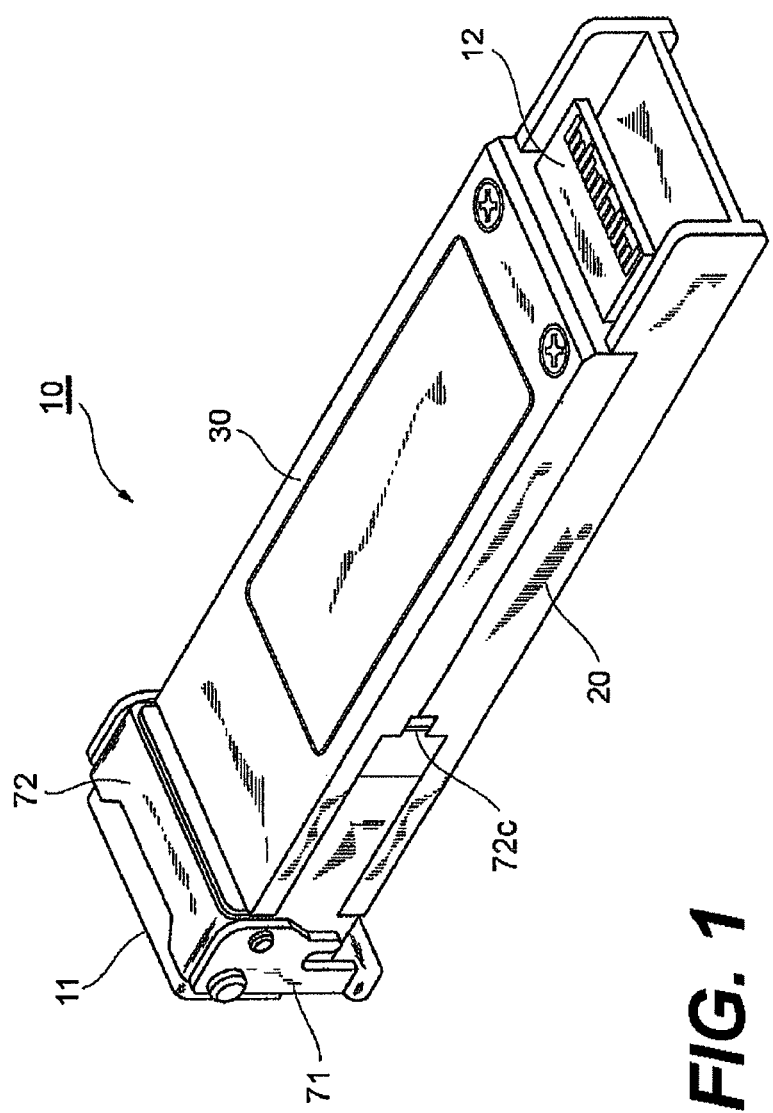
FIG. 1 illustrates an external appearance of the optical transceiver according to the embodiment of the invention.

FIG. 1 is an external appearance of an optical transceiver 10, which is viewed from the bottom side thereof, according to an embodiment of the present invention. The optical transceiver 10 is a type of, what is called, an XFP transceiver whose outer dimensions and electrical specifications are defined by a multi-source agreement (MSA). The transceiver 10 has a housing with the dimension of 18.3.times.71.1.times.8.5 mm.sup.3 and may perform the optical communication with the full-duplex mode and of the transmission speed of 10 Gbps. The transceiver 10 provides an optical receptacle 11 to receive a duplex optical connector with the LC-type in the front side thereof, while, it provides, in the rear side, a plug connector 12 that is mated with an electrical connector prepared in the host system that installs the optical transceiver 10. Here, the front side corresponds to a side where the optical connector is mated, while, the rear side corresponds to a side where the electrical connector is mated. The transceiver 10 also provides an actuator 72 with a curled edge 72c in a tip end thereof that releases the transceiver 10 from the cage on the host system. The actuator 72 may slide in front and rear by rotating a bail 71 in front of the optical receptacle 11. This sliding motion of the actuator 72 may release the engagement of the transceiver 10 with the cage and may extract the transceiver 10 from the cage.

Figure 2:
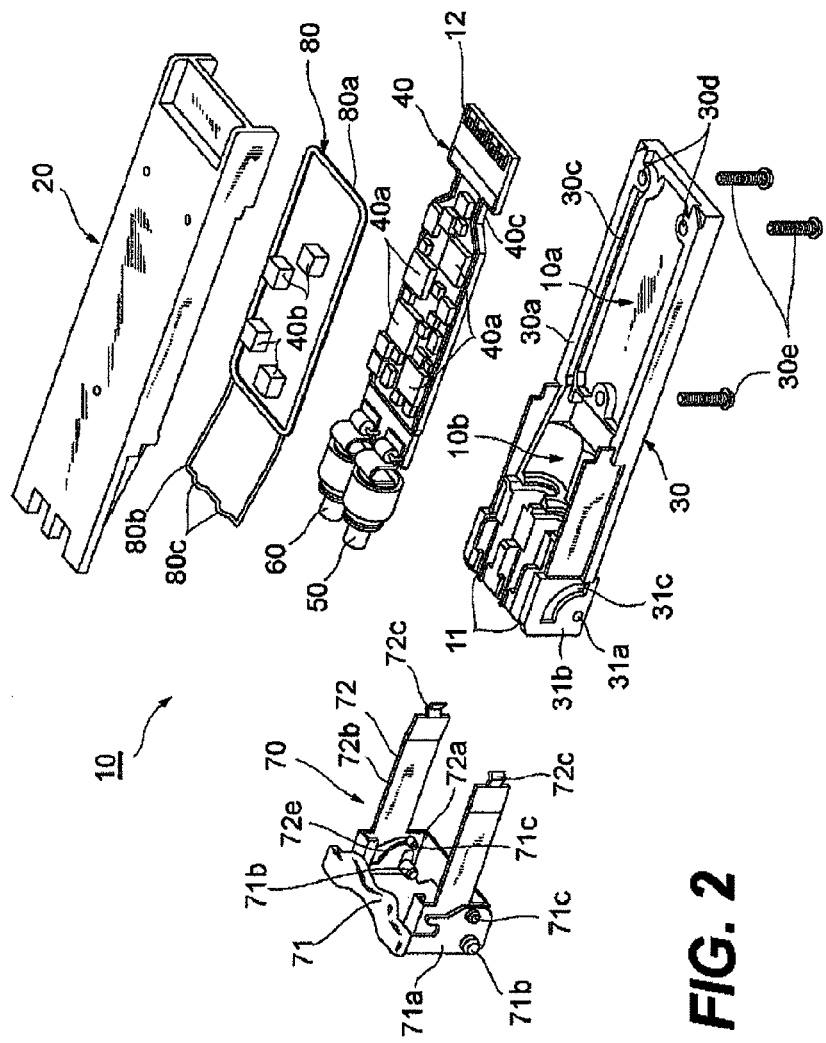
FIG. 2 is an exploded view of the optical transceiver shown in FIG. 1.
Figure 3:
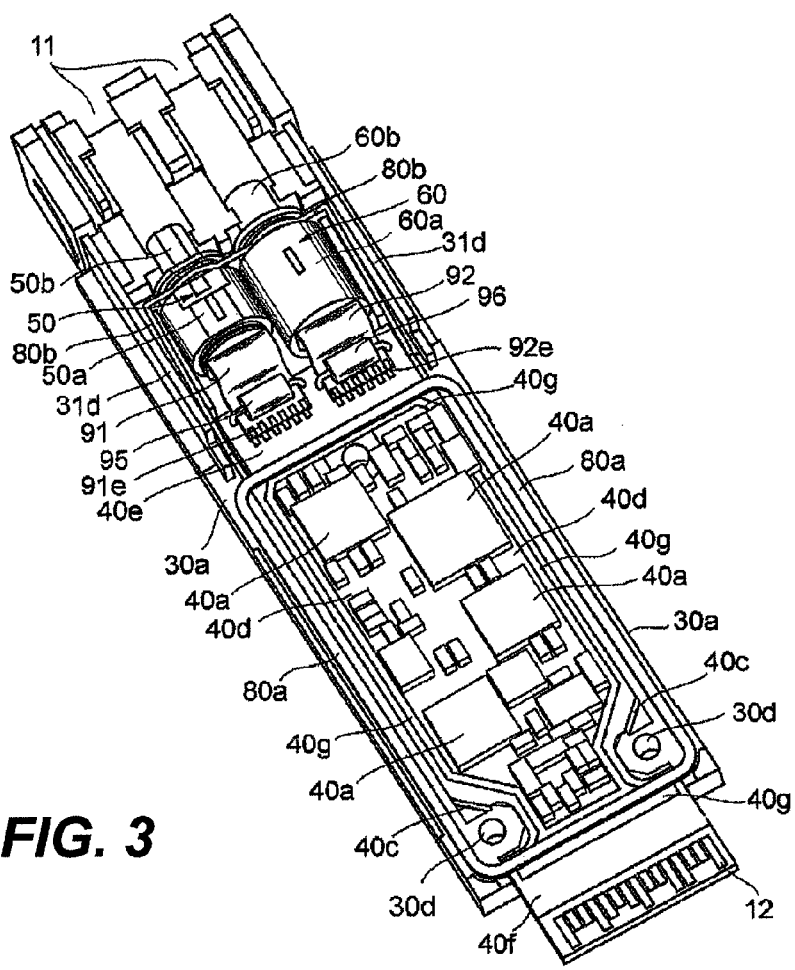
FIG. 3 illustrates an inside of the optical transceiver.

FIG. 2 is an exploded view of the transceiver 10 and FIG. 3 illustrates the inside of the transceiver 10 by removing the upper housing 20. The latch-releasing mechanism 70 includes, as mentioned above, the bail 71 and the actuator 72. These members, 71 and 72, are assembled in the side of the optical receptacle 11. That is, the bail 71 has a reversed U-shape with a pair of leg portions 71a each providing a projection 71b in an inner side thereof. The leg portion 71a further provides another projection 71c in a rear of the first projection 71b. While, the actuator 72 has a normal U-shape set between the leg portions 71a of the bail 71 so as to fit the cross section of the bail 71. The sides 72d of the actuator 72 extend an arm portion 72b toward the rear side of the transceiver 10. The end of the arm portion 72b provides the curled edge 72c.

Inserting the first projection 71b of the bail 71 into the hole 31a formed in the front side wall 31b of the lower housing 30, and setting the second projection 71c in the arched groove 31c also formed in the side wall 31b of the lower housing 30 by passing through the arched slit 72e formed in the side 72d of the actuator 72, the latch-releasing mechanism 70 is assembled with the lower housing 30. Rotating the bail 71 by the first projection 71b as an axis so as to traverse the optical receptacle 11, it causes the sliding motion of the second projection 71c in the arched groove 31c to slide the actuator 72 toward the front side of the transceiver 10. Then, the curled edge 72c in the tip end of the arm portion 72b pushes out the hook of the cage outwardly, which is not illustrated in the figure, to release the engagement between the transceiver 10 and the cage. Thus, the transceiver 10 may be extracted from the cage.

The optical transceiver 10 roughly comprises the upper housing 20, the lower housing 30, the substrate 40 that installs an electronic circuit thereon, the receiver optical transmitter sub-assembly (hereafter denoted as ROSA) 50, the transmitter optical sub-assembly (hereafter denoted as TOSA) 60, and the latch-releasing mechanism 70. The upper and lower housings, 20 and 30, both made of metal die-casting, are assembled to each other as putting the gasket 80 therebetween to electrically shield the circuit on the substrate 40 from the external. The gasket 80 comprises a first gasket 80a that shields a first space 10a where the primary portion of the electronic circuit is installed therein, and a second gasket 80b that shields a second space 10b where the ROSA 50 and the TOSA 60 are installed therein. Assembling the upper housing 20 with the lower housing 30, the optical receptacle 11 is formed in the front side.

The substrate 40, which may be a multi-layered substrate, roughly includes three portions. The first portion 40d installs the primary circuit thereon, is set within the first space 10a and is shielded with the gasket 80a. The second portion 40e includes a plurality of pads connected with the FPC substrates, 91 and 92, each extended from the ROSA 50 and the TOSA 60, and shielded with the second gasket 80b. The third portion 40f includes the connector plug 12 and is exposed in the external. Interconnecting patterns, which connect the connector plug 12 in the third portion 40f with the primary circuit in the first portion 40d, run in the inner layer of the multi-layered substrate 40; while, in the top and back surfaces of the substrate 40 at the boundary between the first 40d and third portions 40f provide the ground patterns 40g that comes in contact with the gasket 80a. This ground pattern 40g in the top surface of the substrate 40 extends into the first portion 40d so as to surround the primary circuit in the first portion 40d. The ground pattern 40g further extends in the boundary between the first 40d and the second 40e portions of the substrate 40 and comes in contact with the gasket 80a thereat again. Thus, the first space 10a may be fully shielded by gasket 80a, the ground pattern 40g and the upper 20 and lower 30 housings.

A conventional optical transceiver often shields the electronic circuit and the optical components as unifying the first space 10a for the electronic circuit with the second space 10b for the optical components. However, such an arrangement is hard to prevent the leakage of the EMI noise thorough the optical path inevitably existing between each sub-assembly, the ROSA 50 or the TOSA 60, and the optical receptacle 11. The optical transceiver 10 according to an embodiment of the present invention provides an additional shielding mechanism in the boundary between the first space 10a for the electronic circuit and the second space 10b for the optical components; accordingly, even the EMI leakage through the optical path is remained, the magnitude of the leakage may effectively reduced.

In order to secure a heat dissipating path from the electronic circuit, in particular, from the ICs 40a on the substrate 40 to the outside, the heat sink 40b is put between the IC 40a and the upper housing 20. The height of the heat sink 40b is adjusted so as to fill a gap between the IC 40a and the upper housing 20. The top of the side wall 30a of the lower housing 30 forms a step 30c with a height of 0.75 mm. Setting the substrate 40 in a peripheral portions thereof on this step 30c, and sandwiched by the upper and the lower housings, 20 and 30, the substrate 40 is assembled with the housings, 20 and 30. A plurality of screws 30e, three screws are illustrated in the figure, fix the lower housing 30 to the upper housing 20 as putting the substrate 40 therebetween. The substrate 40 provides cut portion 40c to run off the rear screw holes 30d in both sides thereof. Fitting this cut portion with the wall of the screw holes 30d, the sliding motion of the substrate 40 in front and rear when the connector plug 12 is mated with the connector on the host system may be prevented in addition that the upper and the lower housings, 20 and 30, put the substrate 40 therebetween.

Figure 4:
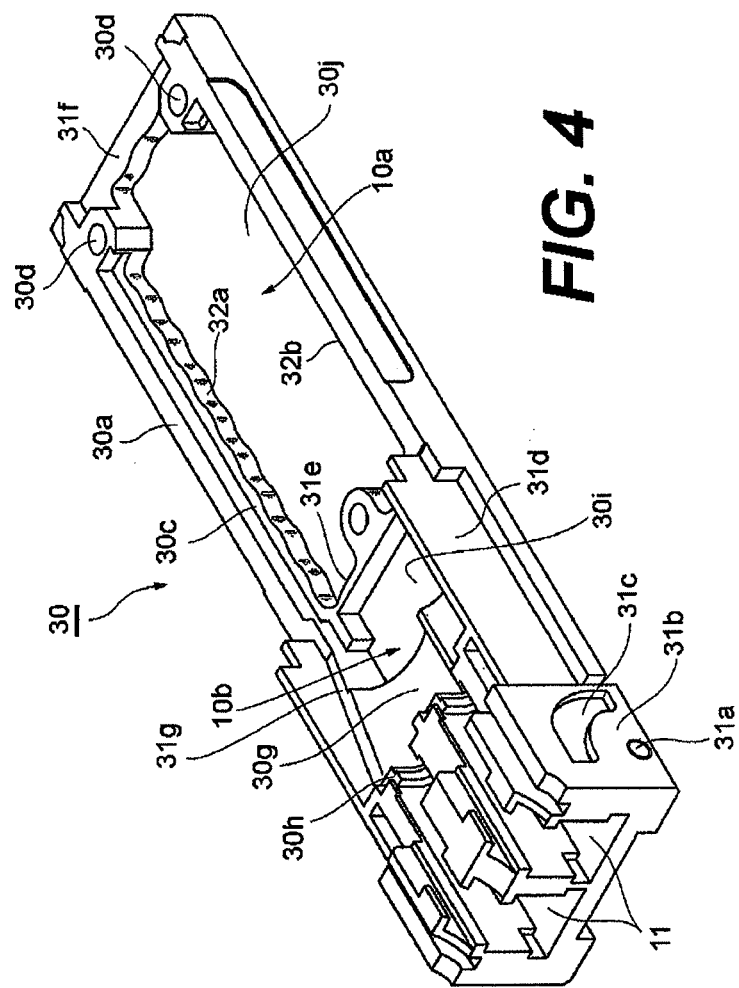
FIG. 4 illustrates a lower housing of the optical transceiver.
Figure 5:
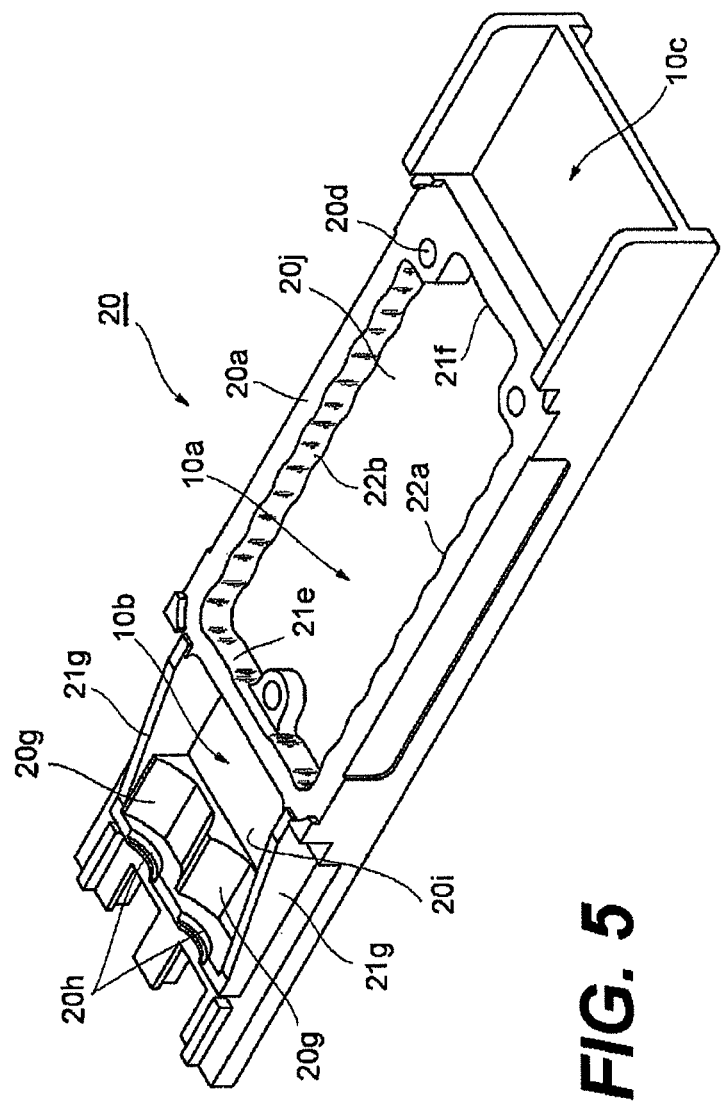
FIG. 5 illustrates an upper housing of the optical transceiver.

FIGS. 4 and 5 illustrate the lower housing 30 and the upper housing 20, respectively. The lower housing 30 provides the primary structure of the optical receptacle 11 in the front end thereof. Assembling the lower housing 30 with the upper housing 20, the optical receptacle 11 with the specification of the LC-type connector is formed. A portion in the rear of the optical receptacle 11 forms the second space 10b for installing the ROSA 50 and the TOSA 60 so as to be surrounded with the side walls 31d and the bottom 30i and the ceiling 20i. The second space 10b provides saddle portions 30g whose shapes fit with the cylindrical outer shape of the ROSA 50 and the TOSA 60. The ribs 30h perform the optical alignment of the ROSA 50 and the TOSA 60, in particular, the sleeve portions 50b and 60b thereof, with respect to the optical receptacle 11. That is, a pair of flanges provided in the sleeve portion, 50b and 60b, puts the rib 30h therebetween, which determines the position of the OSAs, 50 and 60, along respective optical axes. The upper housing 20 provides structures, 20g and 20h, similar to those prepared in the lower housing 30.

The first space 10a is partitioned from the second space 10b by the walls, 21e and 31e, while, it is isolated from the external by the walls, 21f and 31f, in the rear side of the transceiver 10. That is, the first space 10a is surrounded by the side walls, 20c and 30c, in sides thereof, partition walls, 21e and 31e, in the front while other partition walls, 21f and 31f, in the rear and the bottom 30j and the ceiling 20j. Moreover, the first space 10a of the present embodiment has a feature that the inner surfaces, 22a, 22b, 32a and 32b, of respective walls are formed in corrugated. The height of the corrugation is about 0.25 mm in this embodiment, while the pitch thereof is about 3.2 mm in the first sides, 22a and 32a, while, it is about 2.9 mm in the second sides, 22b and 32b, which is different from the first sides.

The transmission speed of the optical communication has continuously increased and it has come to 10 Gbps for the present optical transceiver 10. When an electrical signal with such high frequency components is processed within a closed space, the resonance or the resonance frequency determined by the dimensions of the closed space influences the frequency characteristic of the circuit. The resonance frequency of the transceiver with the dimensions of the XFP type according to the present embodiment becomes a several giga-hertz to several tens of giga-hertz, which just includes or overlaps with the transmission speed of the transceiver 10. When the closed space is determined by the parallel plate, the resonance determined by the inner distance between the walls facing to each other becomes conspicuous and the high frequency characteristic of the circuit within the closed space degrades. The optical transceiver 10 according to the present embodiment has the inner walls with the corrugated shape to moderate the resonance. Moreover, the present transceiver may further reduce the resonance above mentioned by setting the pitches of the respective corrugation different from each other.

Although the upper and lower housings, 20 and 30, illustrated in FIGS. 2 to 5 do not provide any groove to set the gaskets, 80a and 80b, therein in the top of the side walls, an arrangement where the gaskets 80 in such a groove may facilitate the assembly of the transceiver 10.

The second space 10b is formed by the partition walls, 21e and 31e, in the rear end thereof, the saddle portions, 20g and 30g, in the front side thereof, and a double structure of sloped walls, 21g and 31g, and outer walls 31d. Between the partition walls, 21e and 31e, is put with the first gasket 80a, while, between the sloped walls, 21g and 31g, is set with the second gasket 80b. Although the second gasket has a smaller diameter than that of the first gasket 80a, the shielding function is not reduced because there is the double structure of the sloped walls, 21g and 31g, and the outer wall 31d. Because of the existence of the sloped side walls, 21g and 31g, whose top surface smoothly continues from the front partition walls, 21e and 31e, the second gasket 80b may be continuously extended from the partition wall, 21e and 31e, to the saddle portions, 20g and 30g.

Figure 6:
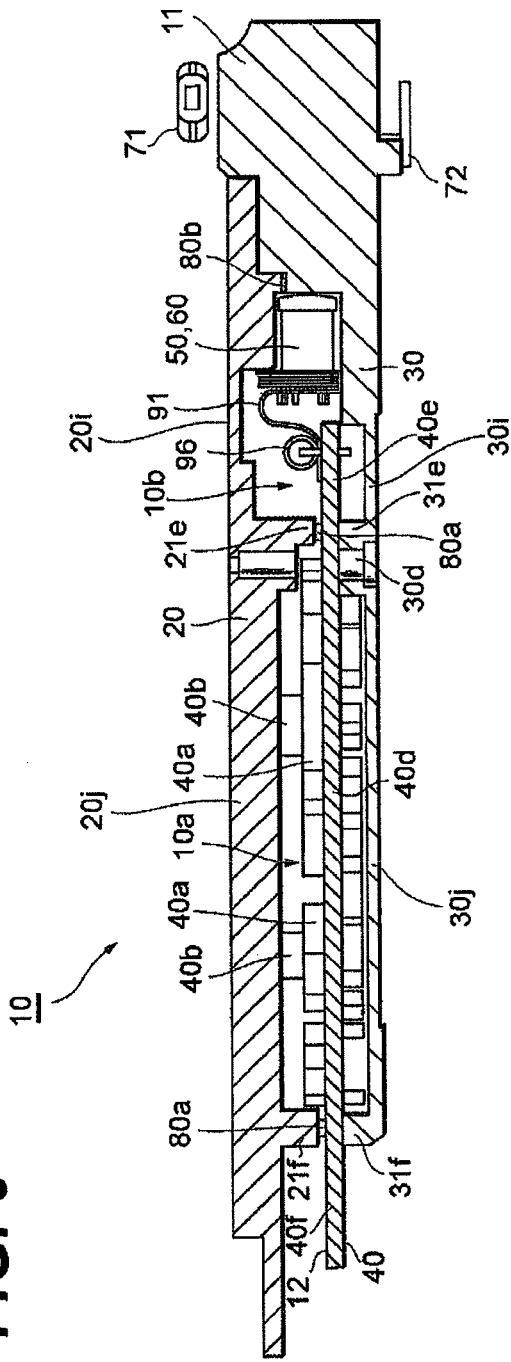
FIG. 6 is a cross section of the optical transceiver taken along the longitudinal direction thereof.

FIG. 6 is a cross section of the transceiver 10 taken along the longitudinal direction thereof. FIG. 6 explicitly illustrates the first and second spaces, 10a and 10b, formed by the upper and lower housings, 20 and 30, with the gasket 80a put between the front side walls, 21e and 31e, and between the rear side walls, 21f and 31f. Moreover, the second space 10b is also surrounded by the other gasket 80b in the front side thereof to electrically shield the second space 10b. Thus, the metal housings, 20 and 30, and two gaskets, 80a and 80b, may effectively shield the first space 10a for the electronic devices, and the second space 10b for the optical components such as the ROSA 50 and the TOSA 60. Moreover, between the IC 40a and the upper housing 20 is inserted with the heat sinks 40b to conduct heat generated by the IC 40a to the cage thorough the housing 20.

Figure 7:
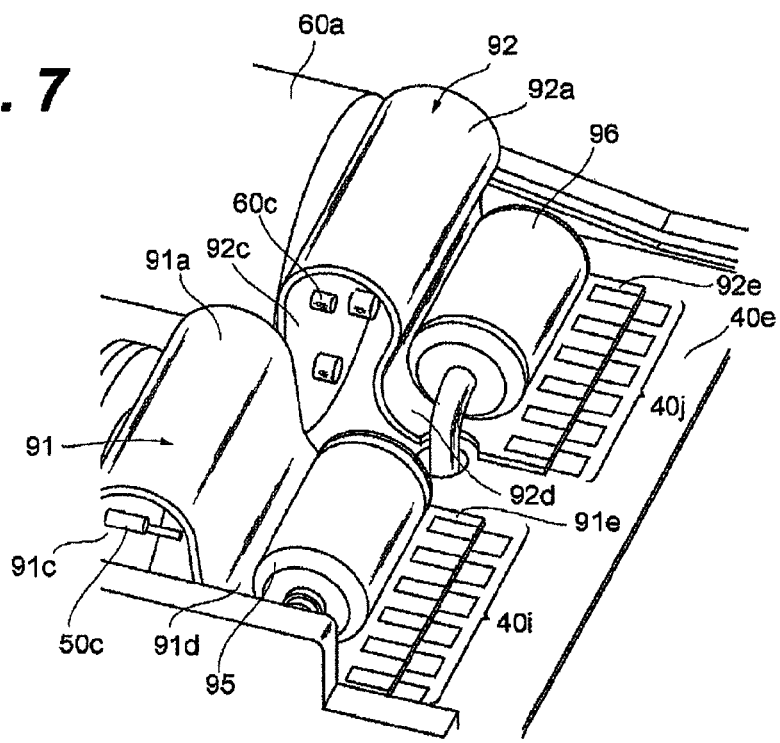
FIG. 7 magnifies a portion where the FPC board is connected with the substrate.
Figure 8:
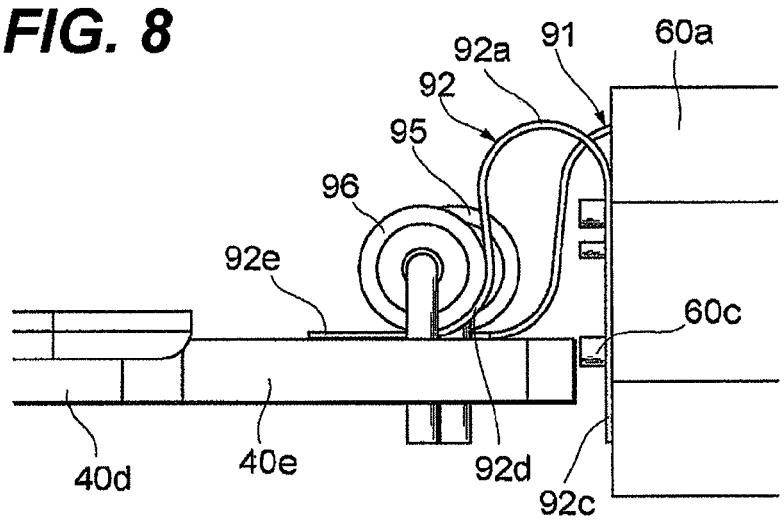
FIG. 8 is a side view of the FPC board with the substrate.

FIGS. 7 and 8 magnify the portion where the ROSA 50 and the TOSA 60 are electrically connected with the substrate 40. The present transceiver 10 connects the OSAs, 50 and 60 with the substrate 40 by respective flexible printed circuits (hereafter denoted as FPC), 91 and 92. That is, the OSAs, 50 and 60, provide the device portion, 50a and 60a, and the sleeve portion, 50b and 60b. The device portion, 50a and 60a, extends a plurality of lead pins, 50c and 60c. The FPC, 91 and 92, is soldered with the lead pin, 50c and 60c, in one end thereof; while, connected with the pads, 40i and 40j, on the substrate 40 in the other end. The FPC, 91 and 92, has a shape that it is extended upward from the point connected with the lead pin, bent downward at the hairpin portion, 91a and 92a, and bent again with substantially right angle toward the rear of the transceiver 10 to be connected with the pad, 40i and 40j, on the substrate 40.

The transceiver 10 of the present embodiment provides a beam lead devices, 95 and 96, on the substrate 40 to bend the FPCS, 91 and 92, at right angle. These lead devices, 95 and 96, are not electrically connected with any circuit components at all. They are prepared only to support to bend the FPCS, 91 and 92. That is, the FPC boards, 91 and 92, whose end, 91e and 92e, is connected with the pads, 40i and 40j, in the top surface of the substrate 40, is bent upwardly at substantially right angle so as to be wound around the outer surface of the lead device, 95 and 96, as being put between the device, 95 and 96, and the substrate 40, folded back at the hair pin portion, 91a and 92a, and is connected at the other end thereof, 91c and 92c, with the lead pins, 50c and 60c, extending from the device portion of the OSAs, 50a and 60a. The lead devices, 95 and 96, used herein may be a type of rectifying diode or a general purposed diode for a small signal application whose diameter is about 1 mil or less. The optical transceiver 10 shown in the figures of the present application has the type of the XFP transceiver whose height is determined by the MSA standard to be 8.5 mm. In a case where the FPC board, 91 and 92, is bent within such a small space, the curvature of the bend inevitably becomes small, which causes a large stress on the connected portion with the substrate 40, namely, the pad, 40i and 40j, soldered with the FPC boards, 91 and 92. This may degrade the electrical reliability of the soldered pad. The optical transceiver 10 of the present embodiment, to relief the stress caused in the pad, 40i and 40j, on the substrate 40, presses the FPC boards, 91 and 92 against the substrate 40 with the lead devices, 95 and 96. Because the lead devices, 95 and 96, are not electrically connected with anywhere, this arrangement for the FPC boards, 91 and 92, does not cause any influence on the electrical performance of the transceiver 10.

Next, a method to assemble the optical transceiver described above will be explained. Firstly, the substrate 40 mounts the electronic components including the ICs 40a thereon by the soldering to make the electronic unit. Concurrently with and independent on the assembly of this electronic unit, the semiconductor optical devices such as a laser diode and a photodiode are assembled in the device portions, 50a and 60a, and optically aligned with the sleeve portions, 50b and 60b, to make the ROSA 50 and the TOSA 60, respectively. The optical alignment of the device portion 50a with the sleeve portion 50b thereof is carried out such that the photodiode in the device portion 50a practically detects an optical signal by a preset magnitude from the test fiber set within the sleeve portion 50b. While, the alignment of the device portion 60a with the sleeve portion 60b in the TOSA 60 is performed such that the laser diode in the device portion 60b emits signal light to the test fiber set in the sleeve portion 60b by being practically provided with the driving current to the laser diode and the signal light is detected from the other end of the testing fiber. Thus, the ROSA 50 and the TOSA 60 are completed.

Secondly, the device portion of respective OSAs, 50a and 60a, are assembled with the FPC boards, 91 and 92. The FPC boards, 91 and 92, provide in one end thereof a plurality of through-holes whose positions correspond to the arrangement of the lead pins extending from the device portion, 50a and 60a. Passing the lead pins into these through-holes and soldering the lead pins with the land around respective through-holes, the FPC boards, 91 and 92, are assembled with respective OSAs, 50 and 60. Subsequently, the other end of the FPC boards, 91e and 92e, are soldered with pads, 40i and 40j, on the substrate 40. Leveling the substrate 40, the sleeve portion of respective OSA, 91c and 92c, heads their tip end upward.

Next, the lead devices, 95 and 96, are set in positions closer to the edge of the substrate 40 compared to the position where the FPC boards is soldered with the pad, 40i and 40j, on the substrate 40. In this process, the lead devices, 95 and 96, press the FPC boards, 91 and 92, against the substrate 40 such that, even when the ROSA 50 and the TOSA 60 are forced to bend the FPC boards, 91 and 92, the pads in the edge of the FPC boards, 91e and 92e, may be free from the stress. Subsequently, the FPC boards, 91 and 92, are bent upward as tracing the outer surface of the lead devices, 95 and 96, and folded back so as to form the hairpin portion, 91a and 92a, and head the tip end of the sleeve portions of the ROSA 50 and the TOSA 60 forward.

Setting the substrate 40 with the ROSA 50 and the TOSA 60 in respective positions 30g of the lower housing 30 and the gaskets, 80a and 80b, on top of the side walls of the lower housing 30, the process puts the upper housing 20 on the lower housing 30. Fixing the housings with the screws, the optical transceiver 10 according to the present embodiment is completed. Here, where the side walls of the lower housing 30 or the upper housing 20 provides the groove in the top thereof and the gasket is set within the sleeve, the assembly of the upper housing 20 with the lower housing 30 may be facilitated.

While the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. An optical transceiver operable in a transmission speed over 10 Gbps, comprising:
    a metal housing to enclose an electronic circuit and an optical subassembly therein, the metal housing having inner side surfaces with a plurality of corrugated shapes at least in a portion to enclose the electronic circuit,
    wherein the inner side surfaces include a first surface and a second surface extending in substantially parallel to each other along a longitudinal direction of the optical transceiver, and
    wherein the corrugated shapes fully cover the first surface and the second surface.

2. The optical transceiver of claim 1,
    wherein the corrugated shapes each has a pitch different from each other.

3. The optical transceiver of claim 2,
    wherein the first surface includes the corrugated shape of a pitch of about 3.2 mm, and the second surface includes another corrugated shape with a pitch of about 2.9 mm.

4. The optical transceiver of claim 1,
    wherein the corrugated shapes have a height of about 0.25 mm.

* * * * *